United States Patent [19]

Fischer et al.

[11] Patent Number: 5,327,017
[45] Date of Patent: Jul. 5, 1994

[54] CIRCUIT ARRANGEMENT FOR SWITCHING OF RF SIGNALS

[75] Inventors: Bertram Fischer, Deisslingen; Gerhard Maier, Dauchingen, both of Fed. Rep. of Germany

[73] Assignee: Deutsche Thomson-Brandt GmbH, Villingen-Schwenningen, Fed. Rep. of Germany

[21] Appl. No.: 884,421

[22] Filed: May 15, 1992

Related U.S. Application Data

[63] Continuation of PCT/EP90/01832, Nov. 2, 1990

[30] Foreign Application Priority Data

Nov. 15, 1989 [DE] Fed. Rep. of Germany ....... 3937934

[51] Int. Cl.⁵ ............................................. H03K 17/76
[52] U.S. Cl. .................................... 307/243; 307/359; 307/285; 307/320; 307/542; 307/551; 328/104; 328/154; 333/103
[58] Field of Search ............... 307/256, 259, 285, 320, 307/542, 542.1, 547, 549, 551, 317.1, 319, 355, 243; 333/81 R, 101, 103, 262; 328/154, 104

[56] References Cited

U.S. PATENT DOCUMENTS

| | | | |
|---|---|---|---|
| 2,657,318 | 10/1953 | Rack | 307/88 |
| 3,715,647 | 2/1976 | Biringer | 307/317.1 |
| 3,720,888 | 3/1973 | Manuali | 307/243 |
| 3,748,499 | 6/1973 | Schaffner | 307/320 |
| 4,316,108 | 2/1982 | Roger, Jr. | 307/521 |
| 4,363,033 | 12/1982 | Lovely | 358/181 |
| 4,574,201 | 3/1986 | Ohyama et al. | 307/243 |
| 4,598,423 | 7/1986 | Hettiger | 455/191 |
| 4,668,882 | 5/1987 | Matsuura | 307/540 |
| 4,679,247 | 7/1987 | Washburn, Jr. | 455/210 |
| 4,848,354 | 6/1989 | Fuller et al. | 307/259 |

FOREIGN PATENT DOCUMENTS

| | | | |
|---|---|---|---|
| 1519740 | 4/1968 | France. | |
| 2612023 | 9/1988 | France. | |
| 0007526 | 1/1981 | Japan | 307/256 |
| 0286023 | 11/1988 | Japan | 307/259 |

OTHER PUBLICATIONS

Chorney, "Multi-Octave, Multi-Throw, PIN-Diode Switches", Sep. 1974, pp.39-48.

Primary Examiner—Timothy P. Callahan
Assistant Examiner—Terry D. Cunningham
Attorney, Agent, or Firm—Joseph S. Tripoli; Peter M. Emanuel; Frederick A. Wein

[57] ABSTRACT

A circuit arrangement for switching-through (transit switching) of RF-signals is provided. The signals from several RF-signal sources are switched via controlled diode paths wherein capacitance diodes are used for achieving a high value of decoupling between sources in the unenergized state.

4 Claims, 2 Drawing Sheets

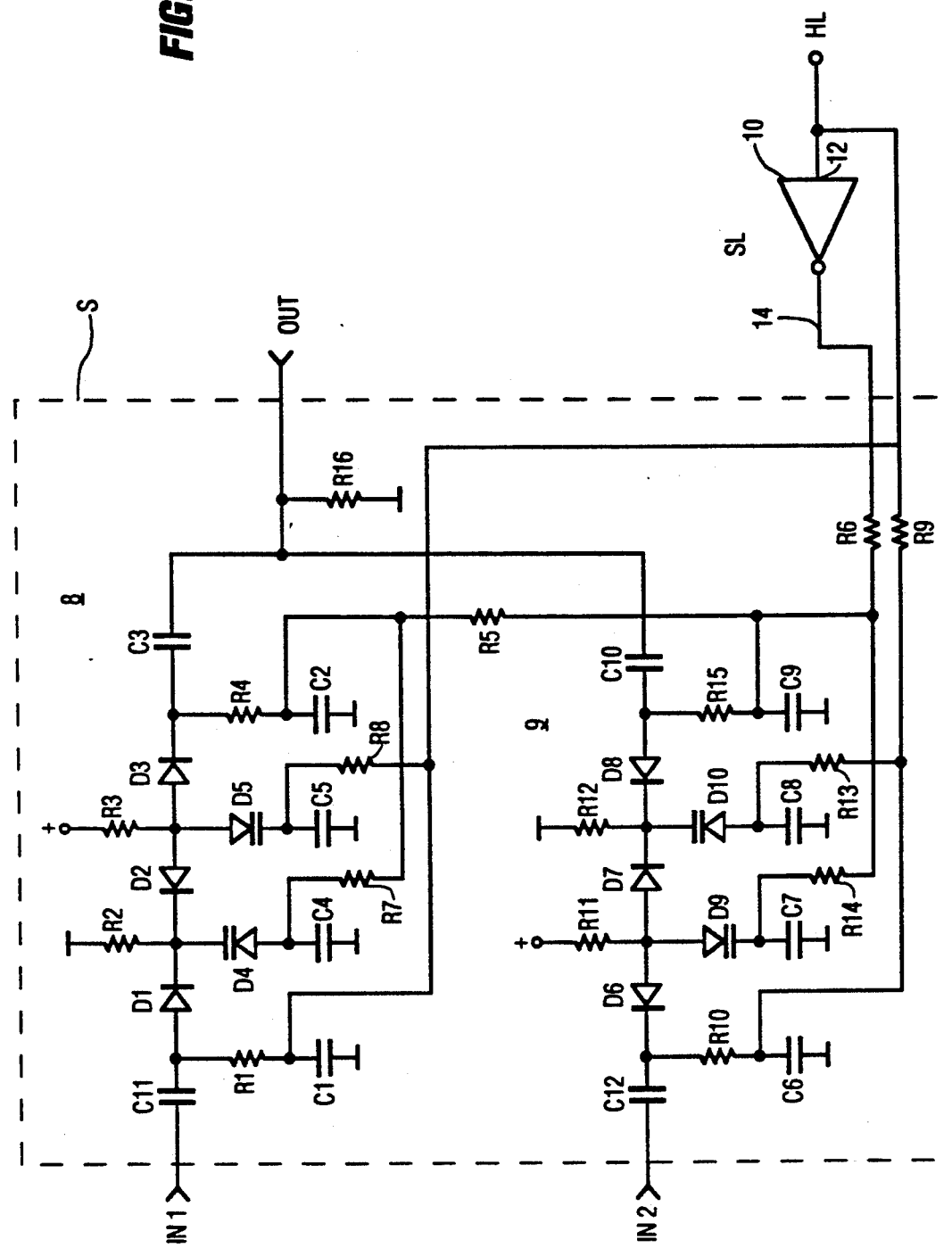

CIRCUIT ARRANGEMENT FOR SWITCHING OF RF SIGNALS

This is a continuation of PCT/EP90/01832 filed Nov. 2, 1990, entitled "CIRCUIT ARRANGEMENT FOR SWITCHING OF RF SIGNALS".

BACKGROUND

The present invention concerns an RF signal switch for providing a high degree of isolation between sources in both the energized and de-energized condition.

It is common for several high frequency (RF) signal sources to be switched at the tuner inputs of an RF receiver such as a television receiver or the like. In such an arrangement it must be guaranteed, that there is sufficient de-coupling between the signal sources. In the United States, the FCC requires attenuation values of more than 80 db for frequencies up to 220 MHz. These values must also be observed in the shut-off condition. Often the RF signal sources are switched-over by the assistance of special relays. In order to make these relays usable for radio frequency, they must be realized using a stripline technique. However, the stripline relay technique is very expensive, and the space required for such a relay and the measures concerning construction and circuitry are very great. Additionally, the life expectancy is limited due to the moving parts.

The present invention is directed to a circuit arrangement overcoming such deficiencies.

SUMMARY

Briefly, a circuit arrangement for switching-through (transit switching) of RF signals is provided. The signals from several RF signal sources are switched via controlled diode paths wherein the capacitance of varactor diodes in the unenergized state shunts the signals to ground thus achieving a high value of decoupling between sources when the switch arrangement is not energized. Such an arrangement is particularly useful in antenna switches of television receivers and satellite installations.

BRIEF DESCRIPTION OF THE DRAWINGS

Reference may be had to the drawings wherein:
FIG. 2 shows the antenna switch of FIG. 1 according to aspects of the present invention.

DETAILED DESCRIPTION OF THE PREFERRED EMBODIMENT

Figure 1:
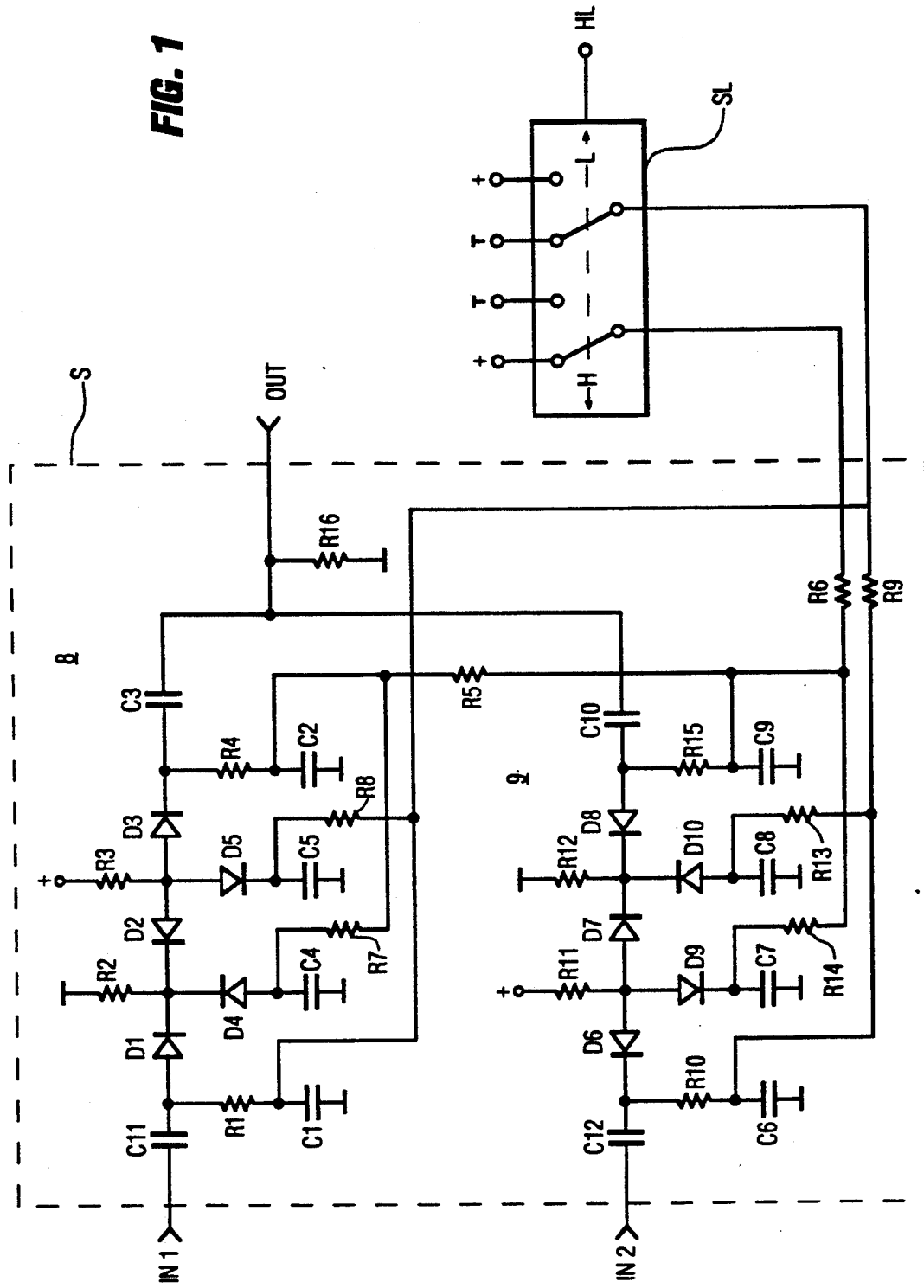
FIG. 1 shows an antenna switch.

The circuit arrangement comprises two branches 8 and 9 having respective input terminals IN1 and IN2, wherein signals present at the respective input terminals can be selectively switched-through via circuit S to the output terminal OUT. The decision as to which input terminal (IN1 or IN2) will be coupled to the output terminal (OUT) is provided by a logic circuit SL.

The logic circuit SL provides an L signal (low) and an H signal (high) which are arbitrarily assigned to a respective one of the branches. In the exemplary embodiment, the L signal has been assigned to branch 8. The symbolically indicated contacts in the logic circuit SL are at the indicated potentials of plus and ground. For the signal at input terminal IN1 to be coupled to the output terminal OUT, the logic circuit SL would be switched into the L position as indicated by the arrow. In such a position, the positive potential is coupled to the upper branch 8 to the junction of resistor R1 and capacitor C1, and is coupled to the anode electrode of diode D1. Capacitor C1 is coupled to ground. Additionally, the positive potential is also coupled via resistor R3 to the anode electrodes of diodes D2, D3, and D5. The cathode of diode D3 is coupled to the negative potential from circuit SL through resistor R4 and the cathodes of D2 and D4 are coupled to the negative potential through resistor R2. The cathode electrode of diode D3 is coupled to signal ground through resistor R4 and capacitor C2. The negative potential from circuit SL is provided through resistors R5 and R6 to the anode of diode D4 and cathode of diode D3. Thus, the longitudinal or series signal passing (or blocking) diodes D1, D2, and D3 are forward biased and input terminal IN1 is switched via said diodes and capacitors C3 and C11 to output terminal OUT across resistor R16. Diodes D4 and D5 are coupled to signal ground via respective capacitors C4 and C5. The cathode of the diode D5 is supplied with a positive blocking potential via the resistor R8. During switch position L, the diodes D4 and D5 are reverse biased in a not conducting state and thus do not shunt the signal to ground. A corresponding analysis for switch position L applied to the lower branch 9 will show that the corresponding diodes are in an opposite bias state inasmuch as the corresponding diodes (D1 and D6, D4 and D9, D2 and D7, D5 and D10, and D3 and D8) are poled for opposite polarity. Thus, in switch position L of the logic circuit SL the diodes D6, D7 and D8 of the lower branch 9 are biased to block the passage of the signal from terminal IN2 to terminal OUT and the diodes D9 and D10 are biased to be conducting shunting the signal to ground so that the signal at input terminal IN2 is both series blocked and shunted to ground and is de-coupled from the signal at input terminal IN1.

In the other switch position of the logic circuit SL (the H or high signal) the other input terminal IN2 is switched through to the output terminal OUT by branch 9 in a manner corresponding to the signal switched through by branch 8 in the L position as discussed above. The ground potential reaches the cathode of diode D6 via the resistors R9 and R10 and signal coupling to ground via the capacitor C6. The cathodes of diodes D7, D8, and D10 are coupled to ground potential via resistor R12. The anode of the diode D6 is coupled to positive potential via the resistor R11 so that diode D6 is conductively biased. The cathode of diode D9 and the anode of diode D10 are at AC ground potential via respective capacitors C7 and C8. The diode D7 is forward biased via the resistor R11 to the positive potential. The positive potential is also applied to diode D8 via the resistors R6 and R15, biasing the same conductively. The resistor R15 is coupled to AC ground via capacitor C9. In this case the input terminal IN2 is coupled to the output terminal OUT via the capacitors C10 and C12, and forward biased series signal passing (or blocking) diodes D6, D7, and D8. The diodes D9 and D10 are reverse biased and thus are switched "off" and do not shunt the signal to AC ground. As discussed above in connection with logic circuit SL in the L position, for the switch SL being in the H position, the corresponding diodes of the upper branch 8 are poled in opposite polarity and attenuate the signal at input terminal IN1.

The values of the resistors R2, R3 and corresponding resistors R11, R12 for respective diodes D2 and D7 are selected such that for each position of the logic circuitry SL the corresponding bias blocking voltage is produced via these diodes.

As stated above, it is desirable that isolation be maintained between input sources even when the television receiver or the like is unenergized. This embodiment, according to aspects of the present invention, is shown in FIG. 2. In order to achieve the desired de-coupling in the case of a very low or no voltage provided to the circuit arrangement, the diodes D4, D5, D9 and D10 are provided as capacitive varactor diodes, which possess due to their capacity-characteristic in the currentless condition, a capacity of sufficient magnitude (e.g. 5 to 40 pF) to shunt the input signal to the required attenuation value. It should be noted that depending upon how much isolation is required, it may be sufficient for only one diode coupled to ground to be a capacitive varactor diode. In such a case, the other shunt diodes can be simple silicon switching diodes. In the exemplary embodiment, it is desirable that the series diodes have a sufficiently low internal resistance when forward biased (rs smaller than 1 Ohm) in order to minimize the insertion attenuation.

In FIG. 2, the circuit is shown using varactor diodes for diodes D4, D5, D9 and D10. Varactor diodes D4, D5, D9, and D10 are switchable as are all of the other diodes according to the bias voltages applied to their respective electrodes and, when the receiver is energized, operate according to the description above in connection with FIG. 1. However, when no energization voltage is provided, the varactor diodes possess a value of about 20 pf–40 pF and the switching diodes D1, D2, D6 and D7, which are not forward biased, have a capacitive value of about 0.8 pF, so that for source signals applied to terminals IN1 and IN2, a capacitive voltage divider results, e.g., a capacitive divider between diodes D1 and D4, D2 and D5, and correspondingly D6 and D9, D7 and D10. In such a case, there is a reciprocal ladder attenuation network between inputs IN1 and IN2 with the receiver denergized.

The logic circuit SL in this embodiment is an inverter 10 wherein H and L signals, provided at input terminal 12, are inverted at output terminal 14. A combination of the signals taken from terminals 12 and 14 provides the logic states as symbolically shown in FIG. 1 for logic circuit SL.

The following component parts have proved suitable for the circuit arrangement:

| | | | |
|---|---|---|---|
| R1: | 2.2 kOhm | C1: | 4.7 nF |
| R2: | 1.0 kOhm | C2: | 4.7 nF |
| R3: | 1.0 kOhm | C3: | 1.0 nF |
| R4: | 2.2 kOhm | C4: | 120 pF |
| R5: | 56 Ohm | C5: | 120 pF |
| R6: | 1.0 kOhm | C6 | 4.7 nf |
| R7: | 56 Ohm | C7: | 120 pF |
| R8: | 56 Ohm | C8: | 120 pF |
| R9: | 56 Ohm | C9: | 4.7 nF |

-continued

| | | | |
|---|---|---|---|
| R10: | 2.2 kOhm | C10: | 1.0 nF |
| R11: | 1.0 kOhm | C11: | 33 pF |
| R12: | 1.2 kOhm | C12: | 33 pF |
| R13: | 56 Ohm | | |
| R14: | 56 Ohm | | |
| R15: | 2.2 kOhm | | |
| R16: | 560 Ohm | | |
| D1, D2, D3, D6, D7, D8: | 1 SS 241 (SIEMENS) | | |
| D4, D5, D9, D10: | BB 811 (TOSHIBA) | | |

As used herein, receiver includes, for example, television receivers, VCR's, satellite receivers, and the like.

We claim:

1. A circuit arrangement of a first and a second input terminals and means for the switching over of RF signals from the first and second input terminals to an output terminal, said means including diodes each having a cathode and an anode, said means comprising:
   the first input terminal being coupled to the output terminal by first, second and third series connected diodes in the order recited, the cathodes of the first and second diodes being connected together and the anodes of the second and third diodes being connected together,
   the cathodes of the first and second diodes being connected to the cathode of a first varactor diode, the anode of the first varactor diode being coupled to a reference potential via a first capacitor,
   the anodes of the second and third diodes being connected to the anode of a second varactor diode, the cathode of the second varactor diode being coupled to the reference potential via a second capacitor,
   the second input terminal being coupled to the output terminal by a fourth, fifth and sixth series connected diodes in the order recited, the anodes of the fourth and fifth diodes being connected together and the cathodes of the fifth and sixth diodes being connected together,
   the anodes of the fourth and fifth diodes being connected to the anode of a third varactor diode, the cathode of the third varactor diode being coupled to the reference potential via a third capacitor,
   the cathodes of the fifth and sixth diodes being connected to the cathode of a fourth varactor diode, the anode of the fourth varactor diode being coupled to the reference potential via a fourth capacitor.

2. The circuit arrangement according to claim 1 whereby isolation between the first input terminal and the second input terminal is provided when the circuit is unenergized.

3. The circuit arrangement according to claim 1 wherein the circuit is provided for a television apparatus.

4. The circuit arrangement according to claim 2 wherein the circuit is provided for a television apparatus.

* * * * *